(12) United States Patent
Tsai (10) Patent No.: US 10,276,465 B2
(45) Date of Patent: Apr. 30, 2019

(54) SEMICONDUCTOR PACKAGE ASSEMBLY (71) Applicant: MEDIATEK INC., Hsin-Chu (TW)

(72) Inventor: Shiann-Tsong Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/638,472

(22) Filed: Jun. 30, 2017

(65) Prior Publication Data
US 2018/0090408 A1 Mar. 29, 2018

Related U.S. Application Data (60) Provisional application No. 62/401,280, filed on Sep. 29, 2016.

(51) Int. Cl.
H01L 23/14 (2006.01)
H01L 23/495 (2006.01)
H01L 23/522 (2006.01)
H01L 23/00 (2006.01)
H01L 23/498 (2006.01)

(52) U.S. Cl.
CPC ........ H01L 23/145 (2013.01); H01L 23/4952 (2013.01); H01L 23/49827 (2013.01); H01L 23/49894 (2013.01); H01L 23/5226 (2013.01); H01L 24/17 (2013.01); H01L 23/49816 (2013.01); H01L 2924/15311 (2013.01)

(58) Field of Classification Search
CPC .. G06F 17/5077; G06F 17/50; G06F 17/5081; G06F 17/5072; G06F 17/5036; G06F 17/509; G06F 17/5045; G06F 2217/06; G06F 17/5068

USPC ........................................................ 257/737
See application file for complete search history.

(56) References Cited

U.S. PATENT DOCUMENTS

| 6,506,633 | B1 * | 1/2003 | Cheng | ................. | H01L 23/5389 |
| | | | | | 257/E21.705 |
| 9,171,739 | B1 | 10/2015 | Roh et al. | | |
| 2004/0137659 | A1 | 7/2004 | Ding et al. | | |
| 2009/0084595 | A1 | 4/2009 | Park et al. | | |
| 2009/0302485 | A1 * | 12/2009 | Fan | ........................ | H01L 23/13 |
| | | | | | 257/780 |
| 2011/0084370 | A1 | 4/2011 | Su et al. | | |
| 2011/0169150 | A1 | 7/2011 | Su et al. | | |

(Continued)

FOREIGN PATENT DOCUMENTS

| EP | 3 051 583 A1 | 8/2016 |
| TW | 471148 B | 1/2002 |
| TW | 200812031 A | 3/2008 |

(Continued)

Primary Examiner — Fernando L Toledo
Assistant Examiner — Adam S Bowen
(74) Attorney, Agent, or Firm — McClure, Qualey & Rodack, LLP (57) ABSTRACT The invention provides a semiconductor package assembly. The semiconductor package assembly includes a core substrate formed of a first material having a device-attach surface and a solder-bump-attach surface opposite to the die-attach surface. A bump pad is disposed on the bump-attach surface. A first solder mask layer formed of the first material covers the bump-attach surface of the core substrate and a portion of the bump pad. A second solder mask layer covers the device-attach surface of the core substrate, wherein the second solder mask layer is formed of a second material.

29 Claims, 3 Drawing Sheets (56) References Cited

U.S. PATENT DOCUMENTS

2013/0251967 A1   9/2013  Zhang et al.
2015/0000965 A1   1/2015  Shiroshita

FOREIGN PATENT DOCUMENTS

TW      201028059 A   7/2010
TW      201622499 A   6/2016

\* cited by examiner

SEMICONDUCTOR PACKAGE ASSEMBLY

CROSS REFERENCE TO RELATED APPLICATIONS

This application claims the benefit of U.S. Provisional Application No. 62/401,280 filed Sep. 29, 2016, the entirety of which is incorporated by reference herein.

BACKGROUND OF THE INVENTION

Field of the Invention

The present invention relates to a semiconductor package assembly, and in particular to a base of a semiconductor package assembly.

Description of the Related Art

In order to ensure the continued miniaturization and multi-functionality of electric products and communication devices, it is desired that semiconductor packages be small in size, support multi-pin connection, operate at high speeds, and have high functionality. The impact of this will be pressure on semiconductor package fabricators to develop fan-out semiconductor packages. However, the increased amount of input/output connections of a multi-functional chip package may induce thermal electrical problems, for example, problems with heat dissipation, cross talk, signal propagation delay, electromagnetic interference in RF circuits, etc. The thermal electrical problems may affect the reliability and quality of products.

Thus, a novel semiconductor package assembly is desirable.

BRIEF SUMMARY OF THE INVENTION

An exemplary embodiment of a semiconductor package assembly is provided. The semiconductor package assembly includes a core substrate formed of a first material having a device-attach surface and a solder-bump-attach surface opposite to the die-attach surface. A bump pad is disposed on the bump-attach surface. A first solder mask layer formed of the first material covers the bump-attach surface of the core substrate and a portion of the bump pad. A second solder mask layer covers the device-attach surface of the core substrate, wherein the second solder mask layer is formed of a second material.

Another exemplary embodiment of a semiconductor package assembly includes a core substrate having a first surface and a second surface opposite to the first surface. A first pad is disposed on the first surface of the core substrate. A solder mask layer covers the first surface of the core substrate. A conductive plug structure has a top portion on the first surface of the core substrate and a bottom portion between the first surface and the second surface of the core substrate.

Yet another exemplary embodiment of a semiconductor package assembly includes a base including a core substrate formed of a first material having device-attach surface and a solder-bump-attach surface opposite to the device-attach surface. A first solder mask layer formed of a first material covers the solder-bump-attach surface of the core substrate. A bump pad is formed on the solder-bump-attach surface of the core substrate. The bump pad is exposed to an opening of the first solder mask layer. A solder-bump structure is in contact with first solder mask layer and is electrically connected to the bump pad.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a semiconductor package assembly. The semiconductor package assembly includes a base including a core substrate having a device-attach surface and a solder-bump-attach surface opposite to the device-attach surface. In some embodiments, the core substrate and a first solder mask layer covering a solder-bump-attach surface of the core substrate may be formed of the same material (e.g. a thermosetting material). The solder mask layer may help to balance the stress applied on the core substrate due to the mismatch of thermal expansion of the coefficient (CTE) between the core substrate and a second solder mask layer, which is disposed on the device-attach surface of the core substrate. Therefore, the reliability of the semiconductor package assembly is improved.

Figure 1:
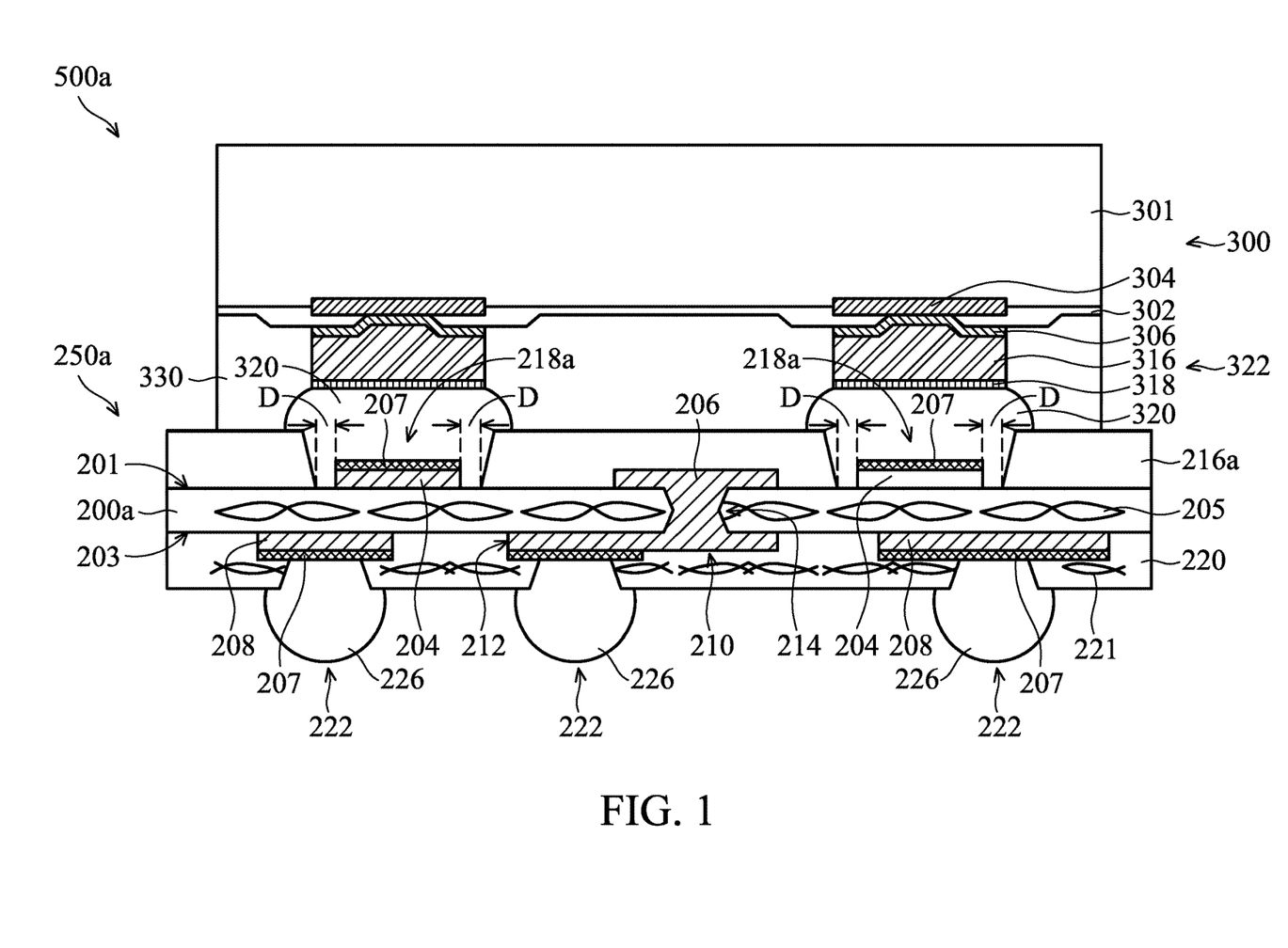
FIG. 1 is a cross-sectional view of a semiconductor package assembly in accordance with some embodiments of the disclosure.

FIG. 1 a cross-sectional view of a semiconductor package assembly 500a in accordance with some embodiments of the disclosure. In some embodiments, the semiconductor package assembly 500a can be a flip chip package using conductive structures, for example, copper pillar bumps, connecting a semiconductor device to a base. In some embodiments, the semiconductor package assembly 500a can be a package using wire bonding technology to connect a semiconductor device to a base. Please refer to FIG. 1, the semiconductor package assembly 500a includes a base 250a. In some embodiments, the base 250a includes a core substrate 200a, device pads 204, bump pads 208, conductive traces 206 and 210, a through via plug 214, solder mask layers 216a and 220. In some embodiments, the base 250a includes a printed circuit board (PCB).

In some embodiments, as shown in FIG. 1, the core substrate 200a of the base 250a includes a device-attach surface 201 and a solder-bump-attach surface 203 opposite to the device-attach surface 201. The device-attach surface 201 of the core substrate 200a is provided for a semiconductor device 300 disposed thereon. The solder-bump-attach surface 203 of the core substrate 200a is provided for solder-bump structures 226 disposed thereon. In some embodiments, the core substrate 200a is formed of thermosetting materials. In some embodiments, the core substrate 200a is formed of resin-base materials. For example, the core substrate 200a may be formed of paper phenolic resin, composite epoxy, polyimide resin BT (Bismaleimide-Triazine) resin or polypropylene (PP) resin. In some embodiments, the core substrate 200a includes glass fibers 205 dispersed therein to reinforce the strength of the base 250a. In some embodiments, the glass fibers 205 are optional.

As shown in FIG. 1 the device pads 204 and the conductive traces 206 are disposed on the device-attach surface 201 of the core substrate 200a. The bump pads 208 and a conductive trace 210 are disposed on the solder-bump-attach surface 203 of the core substrate 200a. In some embodiments, the device pads 204 are electrically connected to a semiconductor device 300, and the bump pads 208 are electrically connected to corresponding solder-bump structures 226. In some embodiments, one or more through via plugs 214 are formed passing through the core substrate 200a. Two terminals (not shown) of the through via plugs 214 are respectively exposed to the device-attach surface 201 and the solder-bump-attach surface 203 of the core substrate 200a. In addition, the two terminals of through via plug 214 are in contact with and electrically connected to the corresponding conductive trace 206 and the corresponding conductive trace 210, respectively. In some embodiments, the conductive trace 206 and the conductive trace 210 may include power trace segments, signal trace segments or ground trace segments. In some embodiments, the conductive trace 210 has a portion 212 serving as a bump pad region of the base 200. The device pads 204, the bump pads 208, the conductive traces 206, the conductive trace 210 and the through via plug 214 may be configured to provide input/output (I/O) connections of the semiconductor device 300 mounted directly onto the base 250a. The device pads 204, the bump pads 208, the conductive traces 206, the conductive trace 210 and the through via plug 214 may be formed of conductive metals including copper or copper alloy. The device pads 204, the bump pads 208, the conductive traces 206, the conductive trace 210 may be formed by the electronic plating process and the subsequent patterning process. The through via plug 214 may be formed by the laser drilling process and the electronic plating process. In some embodiments, Ni/Au layer structures 207 are formed on the device pads 204 and the bump pads 208 by the electro-plating process. In some embodiments, Ni/Au layer structures 207 are optional.

In some embodiments, as shown in FIG. 1, a solder mask layer 216a covers the device-attach surface 201 of the core substrate 200a. The solder mask layer 216a may cover the conductive trace 206 directly on the through via plug 214. The solder mask layer 216a may prevent oxidation of the underlying conductive trace 206. In some embodiments, the solder mask layer 216a has one or more openings 218a to expose the device pads 204. Also, the openings 218a of the solder mask layer 216a may be separated from the device pads 204 by a distance D. The openings 218a of the solder mask layer 216a are separated from the device pads 204 to prevent conductive structures 322 of the semiconductor device 300 disposed on the device pads 204 from short-circuiting with other conductive lines and device pads. Also, the openings 218a of the solder mask layer 216a may provide positions for the conductive structures 322 of the semiconductor device 300 to be bonded thereon. In some embodiments, the solder mask layer 216a includes solder-resistant materials. In some embodiments, the solder mask layer 216a may include photocuring materials, such as photoimageable solder mask materials. In some embodiments, the solder mask layer 216a may include solder mask, or insulating materials including polyimide, Ajinomoto build-up film (ABF), epoxy, polymethylmethacrylate (PMMA) resin, a composite including epoxy and PMMA resin, or polypropylene (PP) resin. In some embodiments, the solder mask layer 216a and the core substrate 200a are formed of different materials. In some embodiments, the solder mask layer 216a may be formed by a coating, a printing process, an adhesion process, a laminating process or another appropriate process.

In some embodiments, as shown in FIG. 1, another solder mask layer 220 covers the solder-ball-attach surface 203 of the core substrate 200a. In addition, the solder mask layer 220 may cover the conductive trace 210 directly on the through via plug 214. The solder mask layer 220 may prevent oxidation of the underlying conductive trace 210. In some embodiments, the solder mask layer 220 has one or more openings 222 to expose the bump pads 208 and the pad portion 212 of the conductive trace 210. Also, the openings 218a of the solder mask layer 216a may be positioned within boundaries of the bump pads 208. In other words, the solder mask layer 216a may partially cover the bump pads 208. The solder mask layer 216a may be adjacent to the bump pads 208. The openings 222 of the solder mask layer 220 may prevent the solder-bump structures 226 disposed on the bump pads 208 from short-circuiting with other conductive lines and bump pads. Also, the openings 222 of the solder mask layer 220 may provide positions for the solder-bump structures 226 to be formed thereon.

In some embodiments, the solder mask layer 220 and the core substrate 200a are formed of the same materials. In addition, the solder mask layer 216a and the solder mask layer 220 may be formed of different materials. For example, the solder mask layer 220 and the core substrate 200a may be formed of thermosetting materials, such as polypropylene (PP) resin. In some other embodiments, the solder mask layer 216a is formed of Ajinomoto build-up film (ABF). In some embodiments, the solder mask layer 220 may include glass fibers 221 dispersed therein to reinforce the strength of the solder mask layer 220. In some embodiments, the glass fibers 221 are optional.

In some embodiments, as shown in FIG. 1, the semiconductor device 300 is mounted on the device-attach surface 201 of the core substrate 200a of the base 250a with an active surface of the semiconductor device 300 facing the base 250a by a bonding process. In some embodiments, the semiconductor device 300 included a die, a package, or a wafer-level package. In some embodiments, as shown in FIG. 1, the semiconductor device 300 is a flip chip package. As shown in FIG. 1, the semiconductor device 300 may include a body 301, metal pads 304 overlying the semiconductor body 301, and an insulation layer 302 covering the metal pads 304. The circuitry of the semiconductor device 300 is disposed on the active surface, and the metal pads 304 are disposed on the top of the circuitry. The circuitry of the semiconductor device 300 is interconnected to the device pads 204 and the conductive trace 206 on the device-attach surface 201 of the core substrate 200a via a plurality of conductive structures 322 disposed on the active surface of the semiconductor device 300. However, it should be noted that the conductive structures 222 shown in FIG. 1 are only an example and is not a limitation to the present invention.

In some embodiments, the conductive structure 322 may include a conductive bump structure such as a copper bump or a solder-bump structure, a conductive wire structure, or a conductive paste structure. In some embodiments, as shown in FIG. 1, the conductive structure 322 may be a copper bump structure composed of a metal stack comprising a UBM (under-bump metallurgy) layer 306, a copper layer 316 such as a plated copper layer, a conductive buffer layer 318, and a solder cap 320. In some embodiments, the UBM layer 306 can be formed on the exposed metal pads 304 within the openings by a deposition method such as a sputtering or plating method and a subsequent anisotropic etching process. The anisotropic etching process is performed after forming conductive pillars. The UBM layer 306 may also extend onto a top surface of the insulation layer 302. In some embodiments, the UBM layer 306 may include titanium, copper, or a combination thereof. A copper layer 316 such as an electroplated copper layer can be formed on the UBM layer 306. The opening can be filled with the copper layer 316 and the UBM layer 306, and the copper layer 316 and the UBM layer 306 within the opening may form an integral plug of the conductive structure 322. The formation position of the copper layer 316 is defined by a dry film photoresist or liquid photoresist patterns (not shown).

In some embodiments, an underfill material or the underfill 330 can be introduced into the gap between the semiconductor device 300 and the base 250a. In some embodiments, the underfill 330 may include a capillary underfill (CUF), molded underfill (MUF), or a combination thereof.

In some embodiments, the solder-bump structures 226 are formed on the solder-bump-attach surface 203 of the core substrate 200a. In addition, the solder-bump structures 226 may be formed filling the openings 222 of the solder mask layer 220 and be electrically connected to the corresponding bump pads 208. In some embodiments, the solder-bump structures 226 may be formed covering portions of a surface of the solder mask layer 220 close to the openings 222. In some embodiments, the solder-bump structures 226 may be formed of materials such as a solder paste. The solder-bump structures 226 may be formed on the bump pads 208 by a deposition process and a patterning process, or printing process/ball attachment process.

Because the solder mask layer 216a are disposed on the device-attach surface 201 of the core substrate 200a, the core substrate 200a may suffer the stress due to the mismatch of thermal expansion of the coefficient (CTE) between the solder mask layer 216a formed of photocuring material and the core substrate 200a formed of thermosetting material. In consideration of the direction of the stress on the core substrate 200a, the solder mask layer 220 covers the solder-bump-attach surface 203 of the core substrate 200a may be formed of the materials that is similar to or the same as the material of the core substrate 200a. The solder mask layer 220 may help to balance the stress form the solder mask layer 216a, so that the thermal cycling reliability of semiconductor package assembly 500a is improved.

Figure 2:
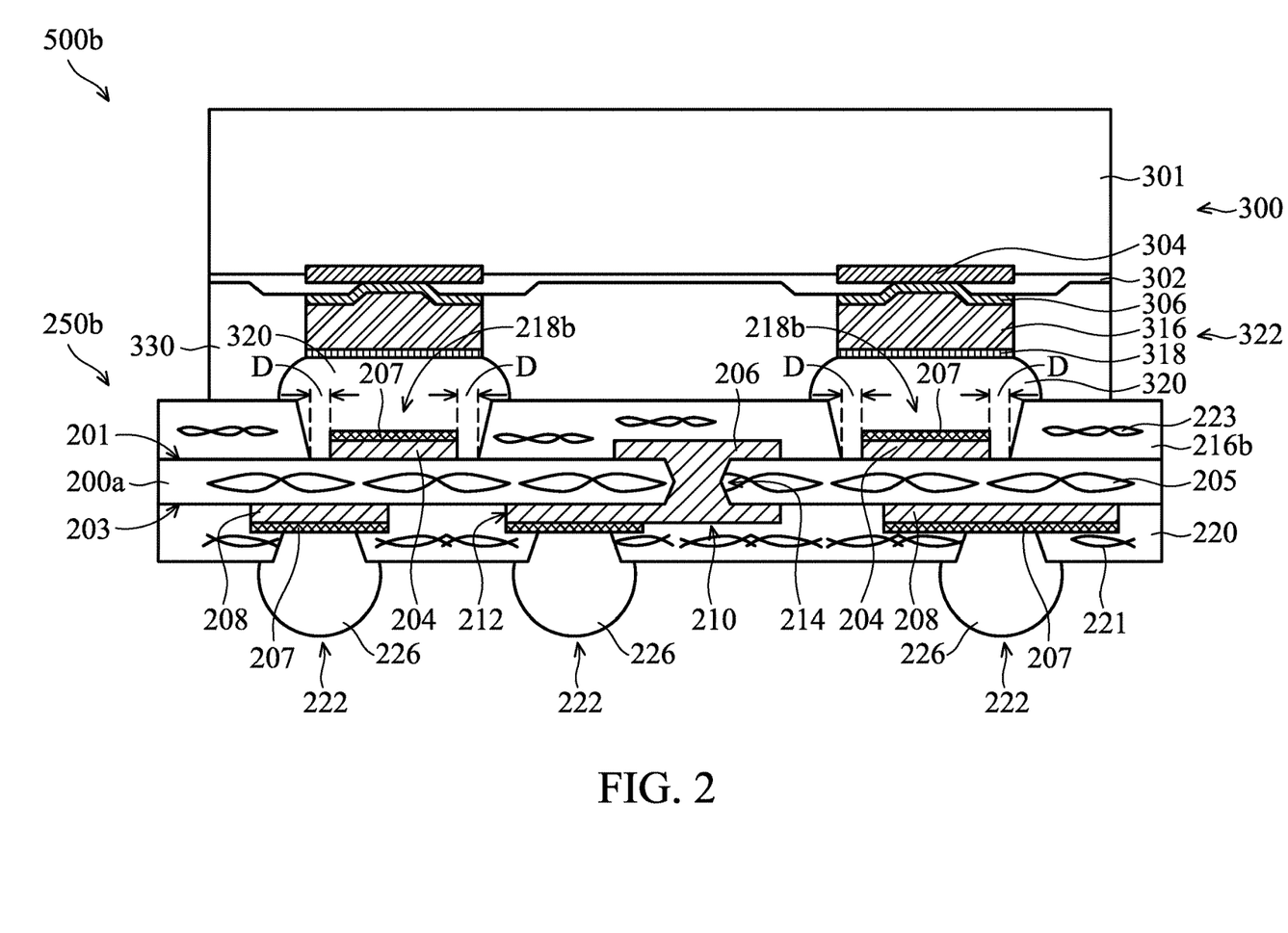
FIG. 2 is a cross-sectional view of a semiconductor package assembly in accordance with some embodiments of the disclosure.

FIG. 2 is a cross-sectional view of a semiconductor package assembly 500b in accordance with some embodiments of the disclosure. Elements of the embodiments hereinafter, that are the same or similar as those previously described with reference to FIG. 1, are not repeated for brevity.

The differences between the semiconductor package assembly 500a (FIG. 1) and the semiconductor package assembly 500b is that the semiconductor package assembly 500b includes a base 250b. The base 250b includes a solder mask layer 216b covers the device-attach surface 201 of the core substrate 200a of the base 250b. The solder mask layer 216b may cover the conductive trace 206 directly on the through via plug 214. The solder mask layer 216b may prevent oxidation of the underlying conductive trace 206. In some embodiments, the solder mask layer 216b has one or more openings 218b to expose the device pads 204. Also, the openings 218b of the solder mask layer 216b may be separated from the device pads 204 by a distance D. The openings 218b are separated from the device pads 204 to prevent conductive structures 322 of the semiconductor device 300 disposed on the device pads 204 from short-circuiting with other conductive lines and device pads. Also, the openings 218b of the solder mask layer 216b may provide positions for the conductive structures 322 of the semiconductor device 300 to be bonded thereon.

In some embodiments, the solder mask layer 216b and the solder mask layer 220 are formed of the same materials. In some embodiments, the solder mask layer 216b and the core substrate 200a are formed of the same materials. For example, the solder mask layer 216b may be formed of thermosetting materials, such as polypropylene (PP) resin. In some other embodiments, the solder mask layer 216b is formed of Ajinomoto build-up film (ABF). In some embodiments, the solder mask layer 216b may include glass fibers 223 dispersed therein to reinforce the strength of the solder mask layer 220.

Figure 3:
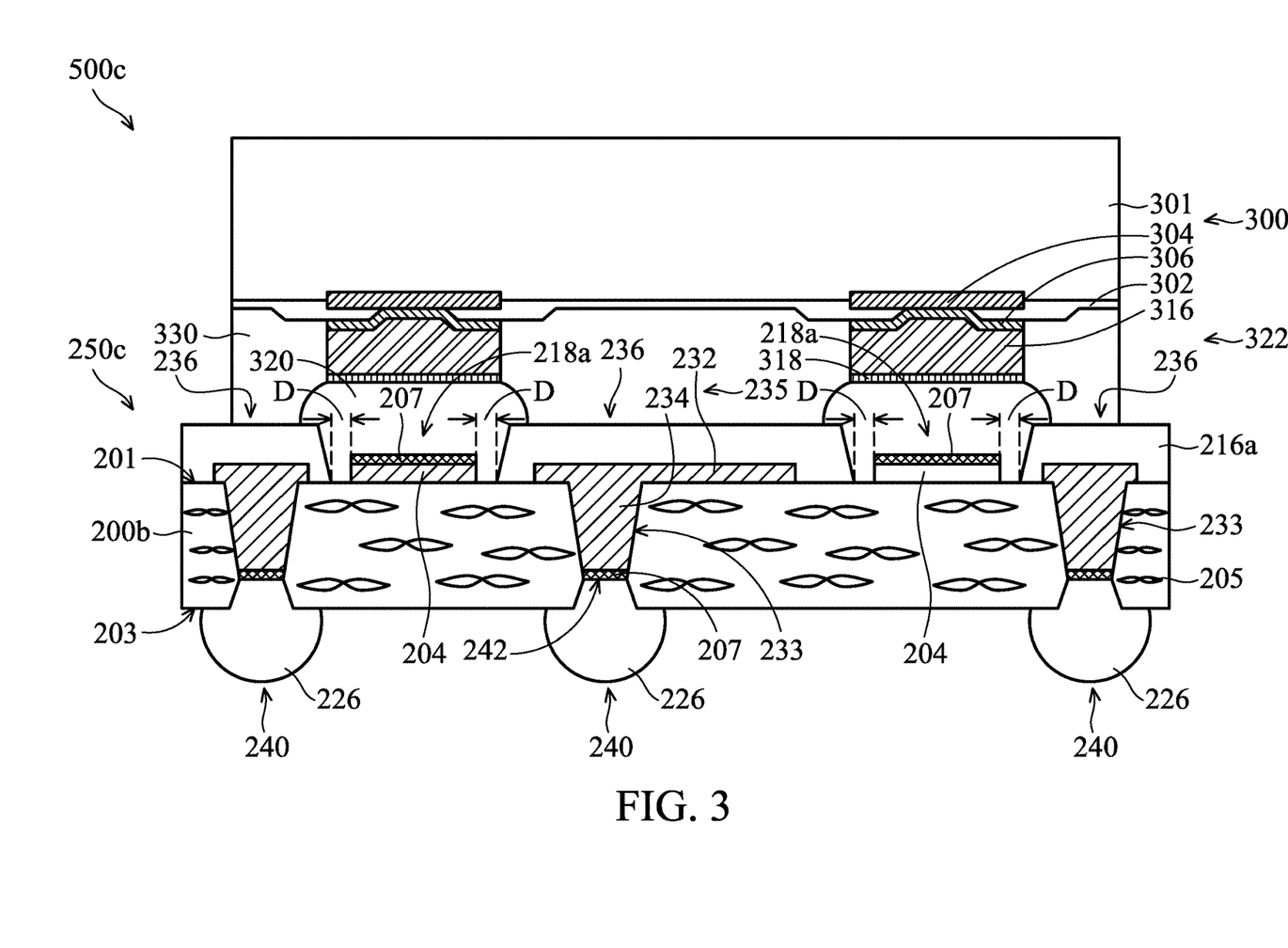
FIG. 3 is a cross-sectional view of a semiconductor package assembly in accordance with some embodiments of the disclosure.

FIG. 3 is a cross-sectional view of a semiconductor package assembly 500c in accordance with some embodiments of the disclosure. Elements of the embodiments hereinafter, that are the same or similar as those previously described with reference to FIG. 1, are not repeated for brevity.

The differences between the semiconductor package assembly 500a (FIG. 1) and the semiconductor package assembly 500c is that the semiconductor package assembly 500c includes a base 250c. In addition, the semiconductor package assembly 500c is fabricated without the solder mask layer 200 shown in FIGS. 1 and 2. In other words, the base 250c of the semiconductor package assembly 500c may require a single solder mask layer (e.g. a solder mask layer 216a) disposed between a semiconductor device (e.g. the semiconductor device 300) and the base 250c. In some embodiments, the base 250c includes a core substrate 200b, device pads 204, a conductive plug structure 235 and the solder mask layer 216a. In some embodiments, the base 250c includes a printed circuit board (PCB).

In some embodiments, FIG. 3 is also used to illustrate one exemplary embodiment of a method for fabricating the base 250c.

In some embodiments, as shown in FIG. 3, the core substrate 200b of the base 250c is provided. The core substrate 200b may include a device-attach surface 201 and a solder-bump-attach surface 203 opposite to the device-attach surface 201. The device-attach surface 201 of the core substrate 200b is provided for the semiconductor device 300 disposed thereon. The solder-bump-attach surface 203 of the core substrate 200b is provided for the solder-bump structures 226 disposed thereon. In some embodiments, the core substrate 200b is formed of thermosetting materials. In some embodiments, the core substrate 200b is formed of resin-base materials. For example, the core substrate 200b may be formed of paper phenolic resin, composite epoxy, polyimide resin BT (Bismaleimide-Triazine) resin or polypropylene (PP) resin. In some embodiments, the core substrate 200b comprises glass fibers 205 dispersed therein to reinforce the strength of the base 250c. In some embodiments, the glass fibers 205 are optional.

In some embodiments, as shown in FIG. 3, trenches 236 are formed in a portion of the core substrate 200b and close to the device-attach surface 201 of the core substrate 200b.

The trenches 236 may be extended downwardly from the device-attach surface 201 of the core substrate 200b. In some embodiments, the trenches 236 are formed by the laser drilling process or chemical etching process, and the subsequent cleaning process (e.g. a desmear process).

In some embodiments, as shown in FIG. 3, the conductive plug structures 235 of the base 250c are respectively formed filling the trenches 236 after the formation of the trenches 236. In other words, the conductive plug structures 235 may be formed passing through a portion of the core substrate 200b. In addition, the device pads 204 are formed on the device-attach surface 201 of the core substrate 200b. In some embodiments, the device pads 204 are formed simultaneously with the conductive plug structures 235. In some embodiments, each of the conductive plug structures 235 has a top portion 232 and a bottom portion 234 connecting to the top portion 232. The top portion 232 of the each of the conductive plug structures 235 may be formed on the device-attach surface 201 of the core substrate 200b. The bottom portion 234 of the each of the conductive plug structures 235 may be embedded in the base 250c and surrounded by the core substrate 200b. In some embodiments, the conductive plug structures 235 and the device pads 204 are formed by the electro-plating process and the subsequent patterning process.

Next, as shown in FIG. 3, the solder mask layer 216a is formed covering the device-attach surface 201 of the core substrate 200b. The solder mask layer 216a may cover the conductive plug structures 235. The solder mask layer 216a may prevent oxidation of the underlying conductive plug structures 235. In some embodiments, the solder mask layer 216a has one or more openings 218a to expose the device pads 204. Also, the openings 218a of the solder mask layer 216a may be separated from the device pads 204 by a distance D. The openings 218a are separated from the device pads 204 to prevent conductive structures 322 of the semiconductor device 300 disposed on the device pads 204 from short-circuiting with other conductive lines and device pads. Also, the openings 218a of the solder mask layer 216a may provide positions for the conductive structures 322 of the semiconductor device 300 to be bonded thereon. In some embodiments, the solder mask layer 216a includes solder-resistant materials. In some embodiments, the solder mask layer 216a may include photocuring materials, such as photoimageable solder mask materials. In some embodiments, the solder mask layer 216a may include solder mask, or insulating materials including polyimide, Ajinomoto build-up film (ABF), epoxy, polymethylmethacrylate (PMMA) resin, a composite including epoxy and PMMA resin, or polypropylene (PP) resin. In some embodiments, the solder mask layer 216a and the core substrate 200b are formed of different materials. In some embodiments, the solder mask layer 216a may be formed by a coating, a printing process, an adhesion process, a laminating process or another appropriate process.

In some other embodiments, the solder mask layer 216a of the semiconductor package assembly 500c is replaced by the solder mask layer 216b shown in FIG. 2. In some embodiments, the solder mask layer 216b and the core substrate 200b are formed of the same materials.

Next, as shown in FIG. 3, trenches 240 are formed in a portion of the core substrate 200b and close to the solder-bump-attach surface 203 of the core substrate 200b after the formation of the solder mask layer 216a. The trenches 240 may be aligned to the corresponding trenches 236. The trenches 240 may be extended upwardly from the solder-bump-attach surface 203 of the core substrate 200b. In addition, the bottom portion 234 of the each of the conductive plug structures 235 is exposed to a bottom of the corresponding trench 240. In some embodiments, the trenches 240 are formed by the laser drilling process or chemical etching process, and the subsequent cleaning process (e.g. a desmear process). After performing the aforementioned processes, the base 250c is formed, as shown in FIG. 3 in accordance with some embodiments.

In some embodiments, Ni/Au layer structures 207 are formed on the device pads 204 and the bottom portion 234 of the each of the conductive plug structures 235 by the electro-plating process. In some embodiments, the Ni/Au layer structures 207 are optional.

In some embodiments, as shown in FIG. 1, the semiconductor device 300 is mounted on the device-attach surface 201 of the core substrate 200b of the base 250c with an active surface of the semiconductor device 300 facing the base 250c by a bonding process. In some embodiments, the solder-bump structures 226 are formed on the bottom portion 234 of the corresponding conductive plug structures 235. In addition, the solder-bump structures 226 may be formed filling the trenches 240 of the core substrate 200b and electrically connected to the bottom portions 234 of the corresponding conductive plug structures 235. Therefore, the bottom portion 234 of the conductive plug structures 235 may serve as bump pad of the base 250c. In some embodiments, a surface 242 of the bump pad (i.e. the bottom portion 234 of the conductive plug structure 235) is between the device-attach surface 201 and the solder-bump structures 226 of the core substrate 200b. Because the bump pad of the base 250a is the bottom portion 234 of the conductive plug structure 235, a boundary 233 of the bump pad (i.e. the bottom portion 234 of the conductive plug structure 235) is (or is aligned to) a boundary of the conductive plug structure 235. In some embodiments, the solder-bump structures 226 may be formed on the bottom portions 234 of the corresponding conductive plug structures 235 by a deposition process and a patterning process, or printing process/ball attachment process.

In some embodiments, the bottom portion 234 of the conductive plug structure 235 serves as a bump pad of the base 250c. The solder-bump structure 226 (e.g. a solder-ball) may be formed extended a portion of the core substrate 200b form the solder-bump-attach surface 203 to electrically connect to a corresponding bump pad (i.e. the bottom portion 234 of the conductive plug structure 235). The base 250c of the semiconductor package assembly 500c is fabricated without forming an additional solder mask layer on the solder-bump surface 302 of the core substrate 200b. Therefore, the semiconductor package assembly 500c may require a single solder mask layer (e.g. the solder mask layer 216a or 216b) disposed on the device-attach surface 201 of the core substrate 200b. The problem of cracks forming at the interface between the solder-bump structure and the solder mask layer on the solder-bump-attach surface of the core substrate of the base can be avoided.

Embodiments provide a semiconductor package assembly. The semiconductor package assembly includes a base including a core substrate having a device-attach surface and a solder-bump-attach surface opposite to the device-attach surface. The base of the semiconductor package assembly includes a first solder mask layer disposed on the solder-bump-attach surface and a second solder mask layer disposed on the device-attach surface. In some embodiments, the first solder mask layer and the core substrate are formed of a first material, the second older mask layer is formed of a second material. In some embodiments, the first solder mask layer covers the solder-bump-attach surface of the core substrate may be formed of the materials that is similar to or the same as the material of the core substrate (e.g. a thermosetting material). The first solder mask layer may help to balance the stress applied on the core substrate due to the mismatch of CTE between the core substrate and the second solder mask layer, which is disposed on the device-attach surface of the core substrate. Therefore, the reliability of the semiconductor package assembly is improved. In addition, the problem of cracks forming at the interface between the solder mask layer and the solder-bump structure on the solder-bump-attach surface of the core substrate of the base can be avoided.

In some embodiments, the core substrate, the first solder mask layer on the solder-bump-attach surface of the core substrate and the second solder mask layer on the device-attach surface of the core substrate are formed of the same material, for example, a thermosetting material. The first solder mask layer and the second solder mask layer of the base may further reduce the mismatch of CTE between the core substrate and the solder mask layers respectively disposed on the device-attach surface and the solder-bump-attach surface of the core substrate. Therefore, the thermal cycling reliability of the semiconductor package assembly is improved.

In some embodiments, the base of the semiconductor package assembly includes a conductive plug structure formed extended in to a portion of the core substrate from the device-attach surface of the core substrate. The conductive plug structure may have a top portion and a bottom portion connecting to the top portion. The top portion of the conductive plug structure is formed on the device-attach surface of the core substrate and serves as a conductive trace. The bottom portion of the conductive plug structure is formed embedded in the of the core substrate without protruding from the core substrate. In some embodiments, the bottom portion of the conductive plug structure, which is close to the bump-attach surface of the core substrate, serves as a bump pad of the base. The solder-bump structure (e.g. a solder-ball) may be formed extended a portion of the core substrate form the solder-bump-attach surface to electrically connect to a corresponding bump pad. Therefore, the semiconductor package assembly may require a single solder mask layer disposed on the device-attach surface of the core substrate. The problem of cracks forming at the interface between the solder-bump structure and the solder mask layer on the solder-bump-attach surface of the core substrate of the base can be avoided.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
    a core substrate formed of a first material having a device-attach surface and a solder-bump-attach surface opposite to the die-attach surface;
    a bump pad disposed on the bump-attach surface; and
    a first solder mask layer formed of the first material covering the bump-attach surface of the core substrate and a portion of the bump pad;
    a second solder mask layer covering the device-attach surface of the core substrate, wherein the second solder mask layer is formed of a second material; and
    a device pad disposed on the device-attach surface of the core substrate, wherein the device pad is exposed from and surrounded by a second opening of the second solder mask layer with the device pad being separated from second solder mask layer.

2. The semiconductor package assembly as claimed in claim 1, wherein the second material is different from the first material.

3. The semiconductor package assembly as claimed in claim 2, wherein the first material comprises a thermosetting material, and the second material comprises a photocuring material.

4. The semiconductor package assembly as claimed in claim 1, wherein the first material comprises polypropylene (PP) resin or Ajinomoto build-up film (ABF).

5. The semiconductor package assembly as claimed in claim 1, wherein the first material layer comprises glass fibers dispersed therein.

6. The semiconductor package assembly as claimed in claim 1, wherein the second material comprises a photoimageable solder mask material.

7. The semiconductor package assembly as claimed in claim 1, further comprising:
    a first conductive trace disposed on the device-attach surface and covered by the second solder mask layer;
    a second conductive trace disposed on the bump-attach surface and covered by the first solder mask layer;
    a through via plug passing through the core substrate, wherein the through via plug is electrically connected to the first conductive trace and the second conductive trace.

8. The semiconductor package assembly as claimed in claim 1, further comprising:
    a conductive plug structure embedded in the core substrate, wherein the bump pad is a portion of the conductive plug structure, and a boundary of the bump pad is aligned to a boundary of the conductive plug structure.

9. The semiconductor package assembly as claimed in claim 1, wherein the bump pad is exposed from a first opening of the first solder mask layer, and the first opening is adjacent to the bump pad.

10. The semiconductor package assembly as claimed in claim 1, further comprising a solder cap disposed in the second opening between the device pad and the second solder mask layer.

11. A semiconductor package assembly, comprising:
    a core substrate having a first surface and a second surface opposite to the first surface;
    a first pad disposed on the first surface of the core substrate;
    a solder mask layer covering the first surface of the core substrate; and
    a conductive plug structure having a top portion on the first surface of the core substrate and a bottom portion between the first surface and the second surface of the core substrate;
    wherein the pad is exposed from and surrounded by an opening of the solder mask layer with the device pad being separated from solder mask layer.

12. The semiconductor package assembly as claimed in claim 11, wherein the core substrate comprises a trench formed extended into a portion of the core substrate form the second surface of the core substrate, and the bottom portion of the conductive plug structure is exposed to a bottom of the trench.

13. The semiconductor package assembly as claimed in claim 11, wherein the conductive plug structure covers the first surface of the core substrate and extended into the core substrate.

14. The semiconductor package assembly as claimed in claim 11, wherein the bottom portion serves as a second pad close to the second surface.

15. The semiconductor package assembly as claimed in claim 14, wherein the core substrate is formed of a first material, the solder mask layer is formed of a second material that is different from the first material.

16. The semiconductor package assembly as claimed in claim 11, wherein the core substrate and the solder mask layer are formed of the same material.

17. The semiconductor package assembly as claimed in claim 15, wherein the first material comprises a thermosetting material, and the second material comprises a photocuring material.

18. The semiconductor package assembly as claimed in claim 15, wherein the first material comprises polypropylene (PP) resin or Ajinomoto build-up film (ABF).

19. The semiconductor package assembly as claimed in claim 15, wherein the first material layer comprises glass fibers dispersed therein.

20. The semiconductor package assembly as claimed in claim 15, wherein the second material comprises a photoimageable solder mask material.

21. The semiconductor package assembly as claimed in claim 11, further comprising a solder cap disposed in the opening between the pad and the solder mask layer.

22. A semiconductor package assembly, comprising:
a base, comprising:
  a core substrate formed of a first material having device-attach surface and a solder-bump-attach surface opposite to the device-attach surface;
  a first solder mask layer formed of the first material covering the solder-bump-attach surface of the core substrate; and
  a bump pad on the solder-bump-attach surface of the core substrate, wherein the bump pad is exposed to an opening of the first solder mask layer;
a solder-bump structure in contact with first solder mask layer and electrically connected to the bump pad;
a second solder mask layer covering the device-attach surface of the base and disposed between the semiconductor device and the base; and
a device pad disposed on the second surface of the core substrate, wherein the device pad is exposed from and surrounded by a second opening of the second solder mask layer with the device pad being separated from second solder mask layer.

23. The semiconductor package assembly as claimed in claim 22, further comprising:
a semiconductor device disposed on the device-attach surface of the core substrate and electrically coupled to a device pad of the base, wherein the device pad is disposed on the device-attach surface of the base.

24. The semiconductor package assembly as claimed in claim 23, further comprising:
a first conductive trace disposed on the device-attach surface and covered by the second solder mask layer;
a second conductive trace disposed on the bump-attach surface and covered by the first solder mask layer;
a through via plug passing through the core substrate, wherein the through via plug is electrically connected to the first conductive trace and the second conductive trace.

25. The semiconductor package assembly as claimed in claim 23, further comprising:
a via plug structure embedded in the core substrate, wherein the bump pad is a portion of the through via plug, and a boundary of the bump pad is aligned to a boundary of the via plug structure.

26. The semiconductor package assembly as claimed in claim 23, wherein the second solder mask layer is formed of a second material that is different from the first material.

27. The semiconductor package assembly as claimed in claim 26, wherein the first material comprises polypropylene (PP) resin or Ajinomoto build-up film (ABF).

28. The semiconductor package assembly as claimed in claim 26, wherein the first solder mask layer comprises glass fibers dispersed therein.

29. The semiconductor package assembly as claimed in claim 26, wherein the second material comprises a photoimageable solder mask material.

* * * * *